United States Patent
Wu et al.

(10) Patent No.: US 9,356,189 B2
(45) Date of Patent: May 31, 2016

(54) LIGHT-EMITTING DEVICE AND METHOD FOR MANUFACTURING THE SAME

(71) Applicant: Epistar Corporation, Hsinchu (TW)

(72) Inventors: Jar-Yu Wu, Hsinchu (TW); Yu-Ming Kun, Hsinchu (TW); Chun-Lung Tseng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 18 days.

(21) Appl. No.: 14/223,495

(22) Filed: Mar. 24, 2014

(65) Prior Publication Data

US 2015/0270432 A1    Sep. 24, 2015

(51) Int. Cl.
| | |
|---|---|
| *H01L 21/00* | (2006.01) |
| *H01L 33/00* | (2010.01) |
| *H01L 27/15* | (2006.01) |
| *H01L 33/38* | (2010.01) |

(52) U.S. Cl.
CPC ........... *H01L 33/0095* (2013.01); *H01L 27/153* (2013.01); *H01L 33/385* (2013.01); *H01L 2933/0016* (2013.01)

(58) Field of Classification Search
CPC .............. H01L 33/0095; H01L 33/647; H01L 2933/0016; H01L 27/154; H01L 33/385; H01S 5/18313
USPC ....................................................... 438/33, 42
See application file for complete search history.

(56) References Cited

U.S. PATENT DOCUMENTS

2009/0267100 A1* 10/2009 Miyake et al. ................... 257/98
2013/0214297 A1*  8/2013 Yang et al. ....................... 257/88

* cited by examiner

*Primary Examiner* — Caridad Everhart
(74) *Attorney, Agent, or Firm* — Muncy, Geissler, Olds & Lowe, P.C.

(57) ABSTRACT

A method for manufacturing a light-emitting device comprising the steps of: providing a substrate; forming a semiconductor epitaxial stack on the substrate; and forming multiple isolation trenches in the semiconductor epitaxial stack by using a laser beam irradiating the semiconductor epitaxial stack to define multiple light-emitting diode units wherein partial of the substrate is exposed by the isolation trenches.

19 Claims, 15 Drawing Sheets

LIGHT-EMITTING DEVICE AND METHOD FOR MANUFACTURING THE SAME

BACKGROUND

1. Technical Field

The present application relates to a light-emitting device with multiple light-emitting diode units.

2. Description of the Related Art

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as an alternative light source for the illumination markets. The LED applies to various applications like the traffic signal, backlight module, street light, and medical instruments, and is gradually replacing the traditional lighting sources.

FIG. 1 illustrates the structure of a conventional light emitting device 100 which includes a transparent substrate 10, a semiconductor stack 12 formed above the transparent substrate 10, and an electrode 14 formed above the semiconductor stack 12, wherein the semiconductor stack 12 includes, from the top, a first conductive-type semiconductor layer 120, an active layer 122, and a second conductive-type semiconductor layer 124.

In addition, the light emitting device 100 can be further connected to other components in order to form a light emitting apparatus. FIG. 2 illustrates a conventional light emitting apparatus including a sub-mount 20 carrying an electrical circuit 202, a solder 22 formed above the sub-mount 20 wherein the light emitting device 100 is bonded to the sub-mount 20 and is electrically connected with the electric circuit 202 on the sub-mount 20 by the solder 22, and an electrical connection structure 24 that electrically connects the electrode 14 of the light emitting device 100 to the electric circuit 202 on the sub-mount 20. The sub-mount 20 may be a lead frame or a large size mounting substrate in order to facilitate circuit design and enhance heat dissipation.

SUMMARY OF THE DISCLOSURE

A method for manufacturing a light-emitting device comprising the steps of: providing a substrate; forming a semiconductor epitaxial stack on the substrate; and forming multiple isolation trenches in the semiconductor epitaxial stack by using a laser beam irradiating the semiconductor epitaxial stack to define multiple light-emitting diode units wherein partial of the substrate is exposed by the isolation trenches.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1:
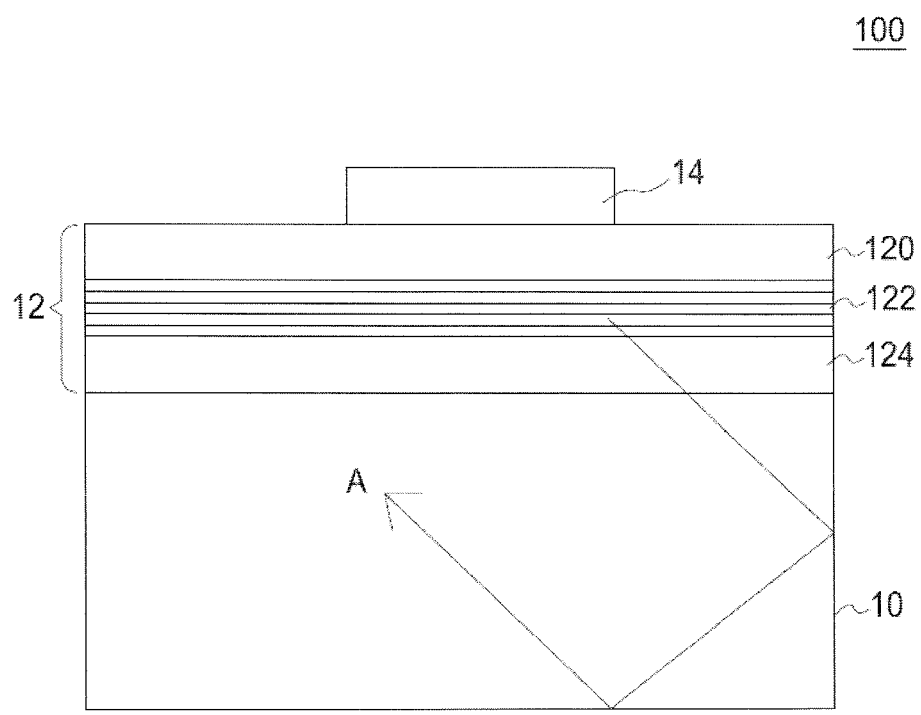
FIG. 1 illustrates the structure of a conventional light emitting device.
Figure 2:
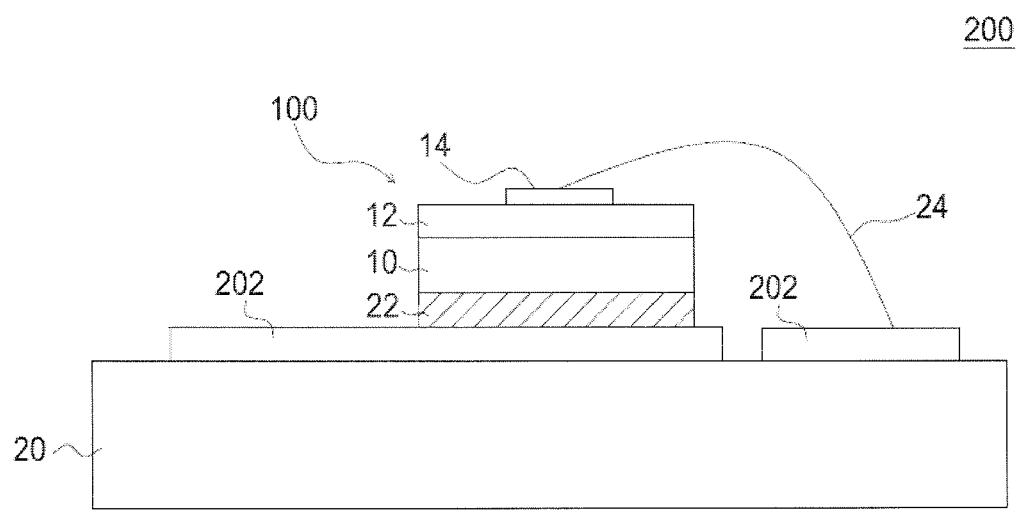
FIG. 2 illustrates the structure of a conventional light emitting apparatus.

Reference is made in detail to the preferred embodiments of the present application, examples of which are illustrated in the accompanying drawings. Wherever possible, the same reference numbers are used in the drawings and the description to refer to the same or like parts.

The present disclosure describes a light-emitting device and a method of fabricating the light-emitting device. In order to have a thorough understanding of the present disclosure, please refer to the following description and the illustrations of FIG. 3A to FIG. 6.

Figure 3A:
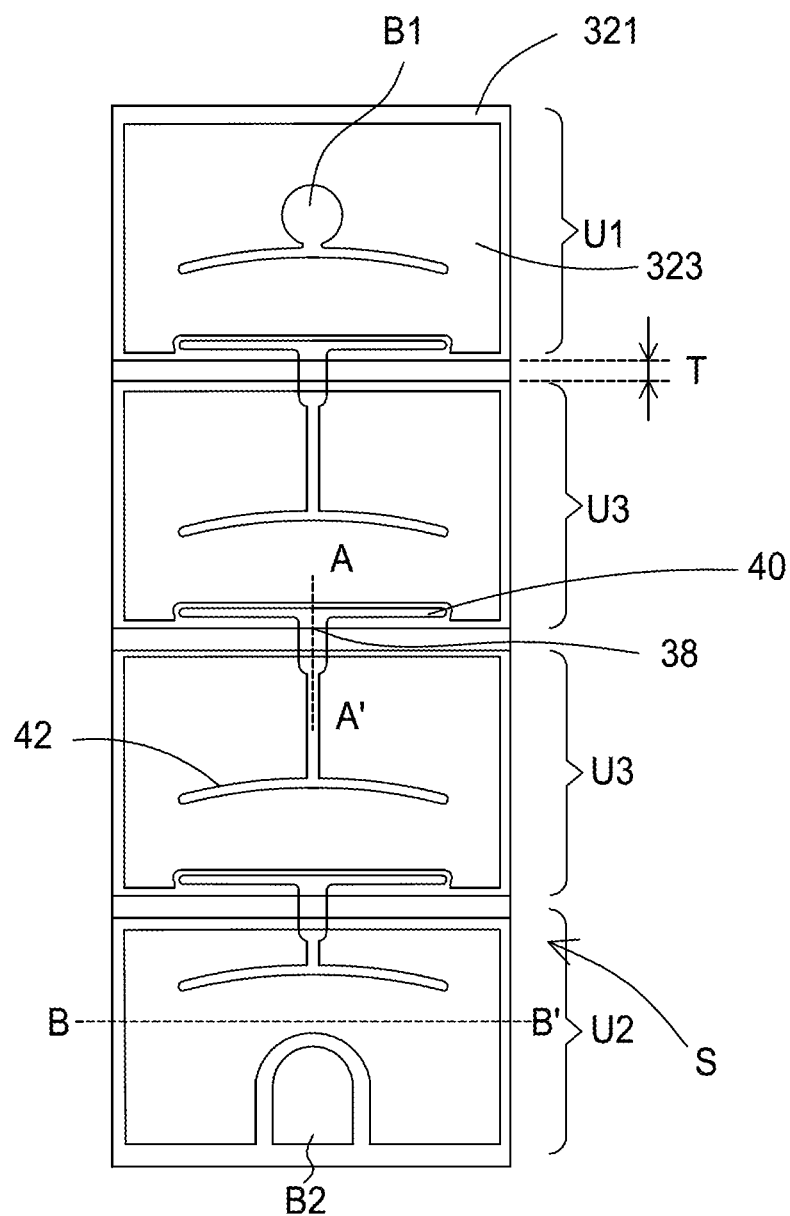
FIGS. 3A~3M illustrate a process flow of a method of fabricating a light-emitting device of the embodiment in the present disclosure.
Figure 3B:
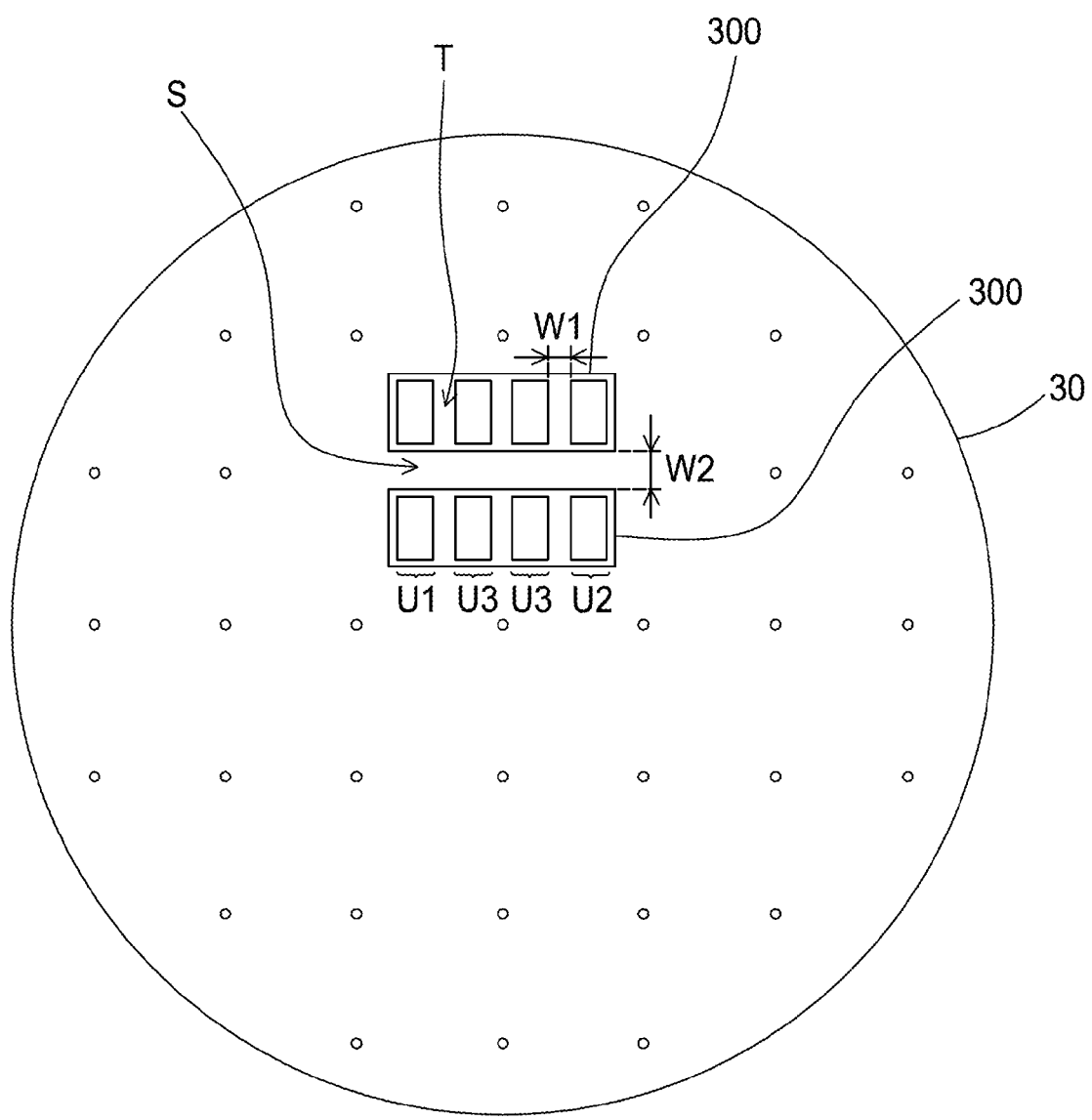

FIGS. 3A~3B illustrate top views of the light-emitting device of an embodiment of the present disclosure. Referring to FIGS. 3A~3B, a light-emitting device 300 comprises a substrate 30, for example, a wafer. A plurality of light-emitting diode units U1, U2, U3 formed on the substrate 30. Each light-emitting diode units U1, U2, U3 comprises a first conductive-type semiconductor layer 321, an active layer (not shown), and a second conductive-type semiconductor layer 323. Multiple isolation trenches T formed between the light-emitting diode units U1, U2, U3 can electrically insulate the light-emitting diode units U1, U2, U3 from each other.

A first electrode 40 is formed on the exposed area of the first conductive-type semiconductor layer 321 of one light-emitting diode unit U1, U2, U3, and a second electrode 42 is formed on the second conductive-type semiconductor layer 323 of each of the light-emitting diode unit U1, U2, U3. A wire 38 is formed to connect the first electrode 40 and the second electrode 42 of adjacent light-emitting diode units to form serial circuits or parallel circuits between the light-emitting diode units U1, U2, U3.

A first bonding pad B1 is formed on the second conductive-type semiconductor layer 323 of the first light-emitting diode unit U1 of the light emitting device 300 and a second bonding pad B2 is formed on the first conductive-type semiconductor layer 321 of the second light-emitting diode unit U2 of the light emitting device 300, and the first bonding pad B1 and the second bonding pad B2 can be connected to the outside circuit. The first electrode 40, the second electrode 42, the first bonding pad B1, and the second bonding pad B2 can be a single layer or a stack, and the material of the first electrode 40, the second electrode 42, the first bonding pad B1, and the second bonding pad B2 can be Cr, Ti, Ni, Pt, Cu, Au, Al, Ag or its alloy.

As FIG. 3B illustrates, a plurality of light-emitting devices 300 with a plurality of light-emitting diode units U1, U2, U3 is formed on the substrate 30. A plurality of singulation trenches S is formed on the periphery of each of the light-emitting device 300 for singulating the multiple light-emitting diode units U1, U2, U3 into a plurality of the light emitting devices 300. In one embodiment, the singulation trenches S are formed by irradiating a laser beam. To be more specific, the singulation trenches S are formed by a laser beam irradiating from a side of the substrate 30 the same side or the opposite side of the first conductive-type semiconductor layer 321.

In one embodiment, the singulation trenches S are formed before or after the plurality of the isolation trenches T is formed. The steps of forming the singulation trenches S include a first step of forming first sub-trenches through the first conductive-type semiconductor layer 321, the active layer (not shown), and the second conductive-type semiconductor layer 323 to a depth of the substrate 30 and a second step of forming second sub-trenches through the substrate 30 from either side of the substrate 30. The singulation trenches S are not overlapped with the isolation trenches T, and the width of each of the singulation trenches S is larger than the width of the isolation trench T.

In one embodiment, a by-product (not shown) is formed in the singulation trenches S during the laser irradiation process. The by-product contains the debris of laser irradiation from the semiconductor epitaxial stack 32 and the substrate 30. Because of the laser irradiation, the surface of the sidewall of the singulation trenches S may be roughed.

Following, the semiconductor epitaxial stack 32 is put into a warm chemical solution, e.g. an acid solution, for a predetermined period of time to perform a wet etching to remove the by-product. The composition of the chemical solution can be phosphoric acid ($H_3PO_4$) and sulfuric acid ($H_2SO_4$). The preferred cleaning temperature of the chemical solution is higher than the atmospheric temperature. In one embodiment, the temperature of the chemical solution is 175~300° C. In one embodiment, the predetermined period of time can be 1~20 minutes.

The composition ratio of the chemical solution can be changed based on the user requirement. If the user prefers a shorter cleaning time, a chemical solution with a higher ratio of the $H_2SO_4$ and higher cleaning temperature can serve the purpose. The chemical solution has a good selectivity between the by-products and the substrate 30.

Figure 3C:
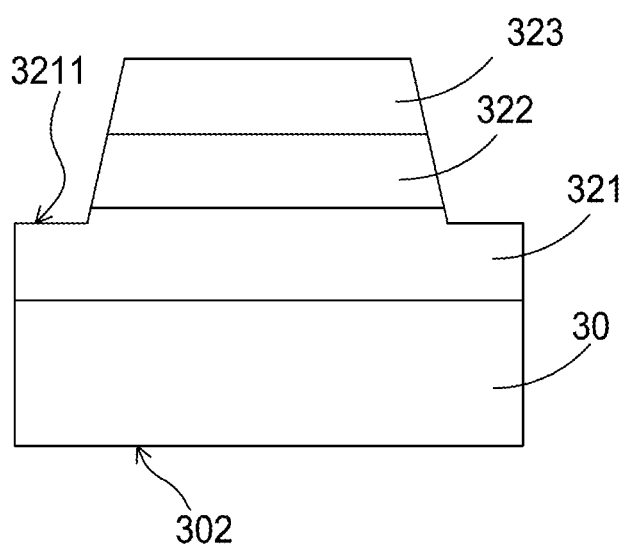

FIG. 3C illustrates the cross-sectional view along with line BB' in FIG. 3A. The first conductive-type semiconductor layer 321 has an exposed surface 3211 in the singulation trench S and covers the substrate 30. In other words, the sidewalls of the second conductive-type semiconductor layer 323, the active layer 322, and part of the first conductive-type semiconductor layer 321 are exposed wherein the exposed sidewalls are preferably not perpendicular to the exposed surface 3211.

Figure 3D:
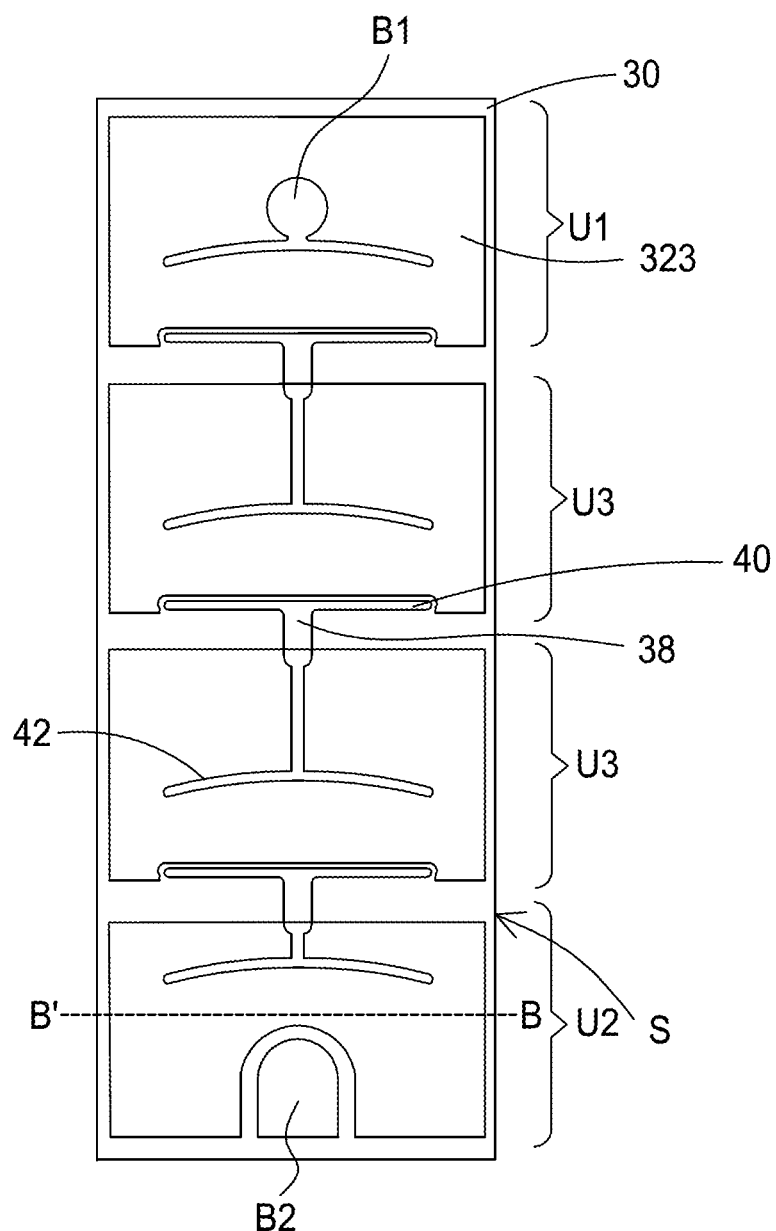
Figure 3E:
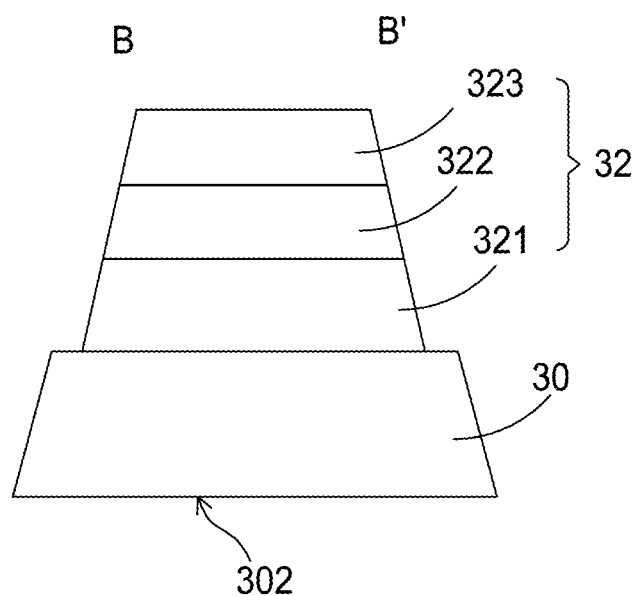

FIGS. 3D~3E illustrate another embodiment in this application, FIG. 3D illustrates the top view of the light-emitting device 300' in this embodiment, and FIG. 3E illustrates the cross-sectional view along with line BB' in FIG. 3D. In this embodiment, after forming the singulation trenches S by a laser irradiation or the wet etching process, the sidewall of the semiconductor epitaxial stack 32 is roughed. A dry etching process such as inductively coupled plasma (ICP) is performed on the sidewall of the semiconductor epitaxial stack 32 to planarize the roughed sidewall. By this etching process, partial of the upper surface of the substrate 30 is exposed and has a slope about the same as at least one of the slopes of the sidewalls of the first conductive-type semiconductor layer 321, the active layer 322, and the second conductive-type semiconductor layer 323. In one embodiment, the sidewalls of the first conductive-type semiconductor layer 321, the active layer 322, and the second conductive-type semiconductor layer 323 have the same slope and form a line.

In the present embodiment, each light-emitting device 300 can be divided by the singulation trenches S to form multiple individual dies, and each individual die comprises a predetermined number of light-emitting diode units U1, U2, U3. In this embodiment, there are four light-emitting diode units U1, U2, U3 in one light-emitting device 300. The width of the isolation trenches T can be W1 and the width of the singulation trenches S can be W2. In one embodiment, W2 is equal to or larger than W1.

Figure 3F:
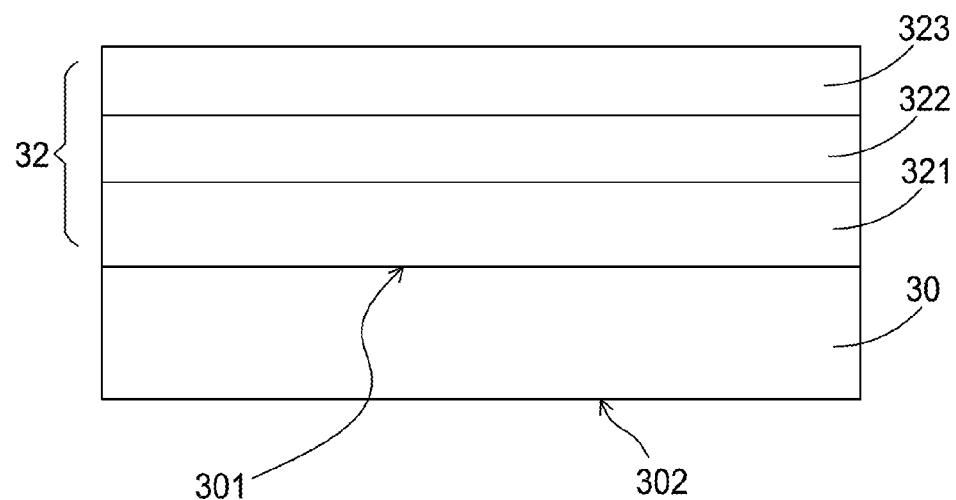

FIGS. 3F to 3K illustrate a detail process flow of the method of fabricating the light-emitting device of an embodiment of the present disclosure. FIG. 3F illustrates the cross-sectional view along with line AA' in FIG. 3A. A substrate 30 including a first major surface 301 and a second major surface 302 wherein the first major surface 301 is opposite to the second major surface 302 is provided. Following, a semiconductor epitaxial stack 32 is formed on first major surface 301 of the substrate 30, wherein the semiconductor epitaxial stack 32 includes a first conductive-type semiconductor layer 321, an active layer 322, and a second conductive-type semiconductor layer 323.

The first conductive-type semiconductor layer 321 and the second conductive-type semiconductor layer 323 are different in electricity, polarity, or dopant, or are different in semiconductor materials used for providing electrons and holes, wherein the first conductive-type semiconductor layer 321 and the second conductive-type semiconductor layer 323 can be single semiconductor material layer or multiple semiconductor material layers. The polarity can be chosen from any two of p-type, n-type and i-type. The active layer 322 is disposed between the first conductive-type semiconductor layer 321 and the second conductive-type semiconductor layer 323 where the electrical energy and the light energy can be converted or stimulatively converted. The devices which can convert or stimulated convert the electrical energy into the light energy can be light-emitting diode, liquid crystal display, and organic light-emitting diode. The devices which can convert or be stimulatively converted the light energy into the electrical energy can be solar cell and optoelectronic diode. The material of the first conductive-type semiconductor layer 321, the active layer 322 and the second conductive-type semiconductor layer 323 includes one or more than one element selected form Ga, Al, In, As, P, N, Si. To be more specific, the material of the first conductive-type semiconductor layer 321, the active layer 322 and the second conductive-type semiconductor layer 323 can be aluminum gallium indium phosphide (AlGaInP) series material, aluminum gallium indium nitride (AlGaInN) series material and so on or ZnO-based material.

The structure of the active layer 322 can be single heterostructure (SH), double heterostructure (DH), double-side double heterostructure (DDH) or multi-quantum well (MQW) structure, wherein the wavelength of the light emitted from the active layer 322 can be changed by adjusting the number of the pairs of MQW.

Figure 3G:
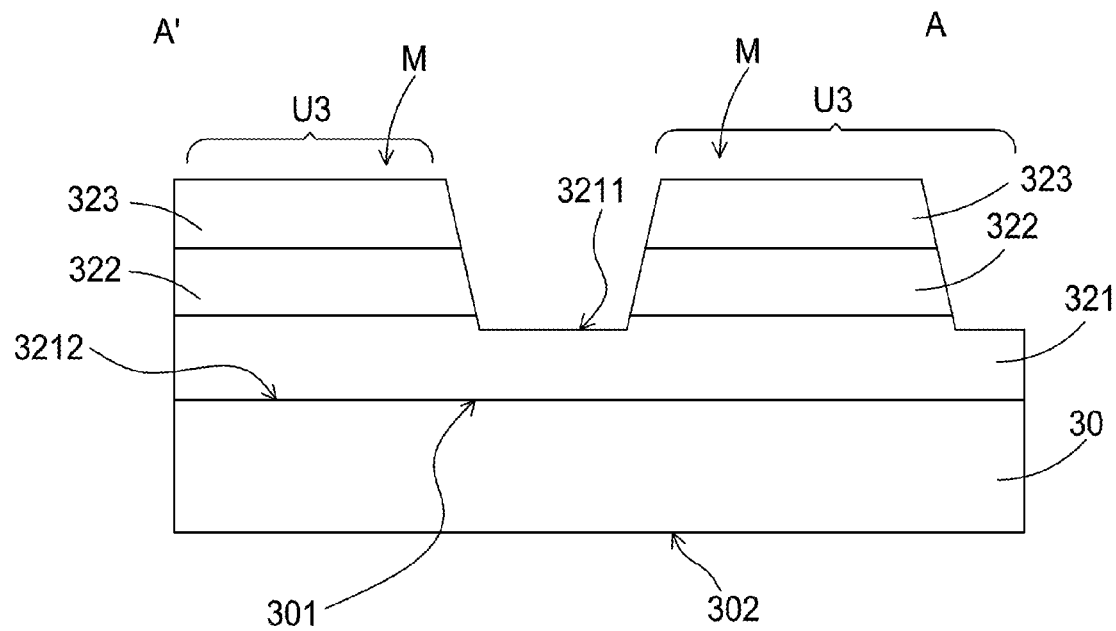

FIG. 3G illustrates the semiconductor epitaxial stack 32 is etched to expose partial of the exposed surface 3211 of the first conductive-type semiconductor layer 321 by the lithography etching process to form mesa regions M and divide the semiconductor epitaxial stack 32 into two light-emitting diode units U3.

Figure 3H:
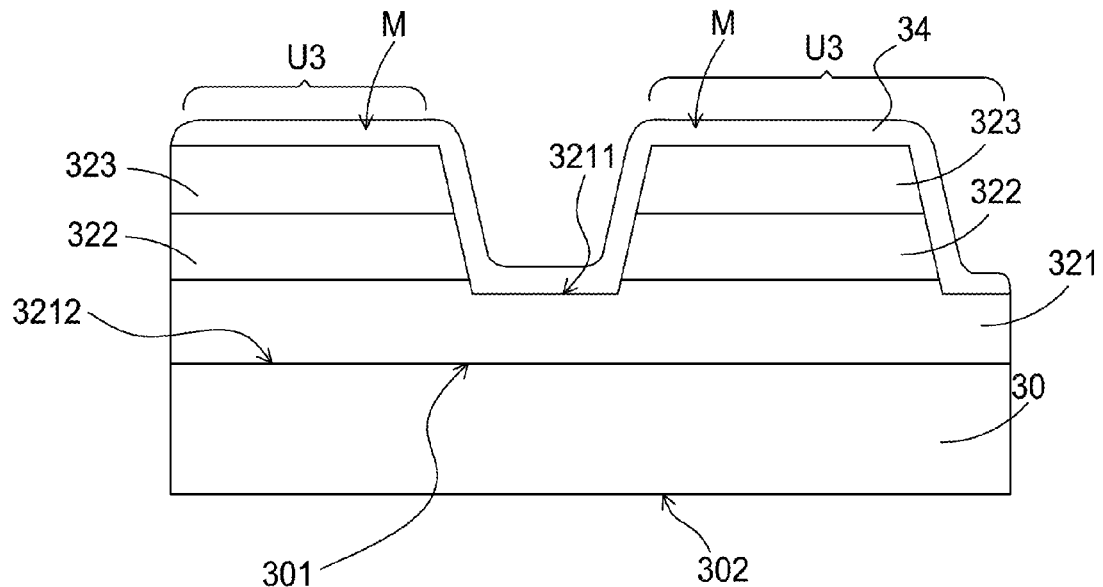

Following, FIG. 3H illustrates forming a protective layer 34 on the upper surface of the second conductive-type semiconductor layer 323, the exposed surface 3211 of the first conductive-type semiconductor layer 321 and the exposed sidewall of the mesa region M. The material of the protective layer 341 can be gold, platinum, titanium, $Ta_2O_4$, $TiO_2$, $Al_2O_3$, Si, carbon film, $Si_3N_4$, $SiO_2$, epoxy, and photoresist.

Figure 3I:
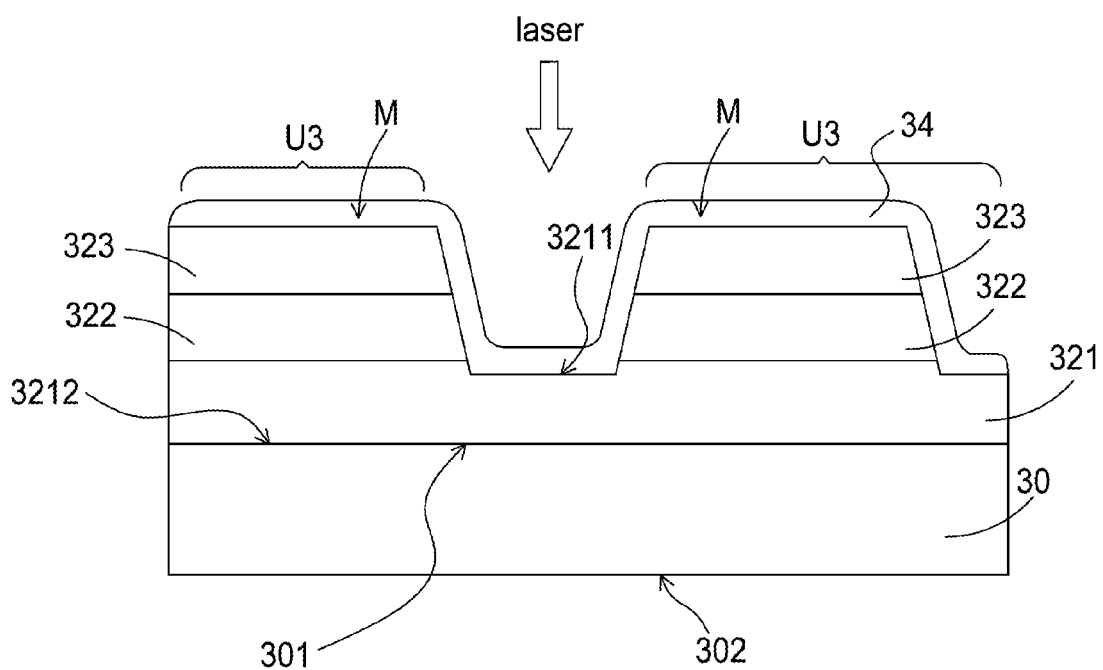
Figure 3J:
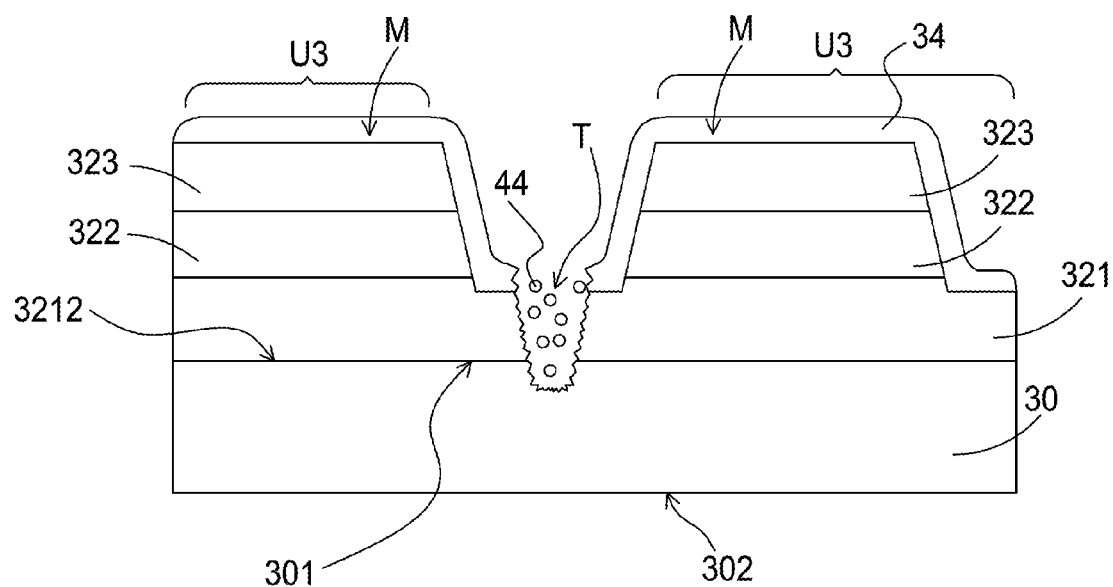

Following, FIGS. 3I-3J illustrate irradiating a laser beam between the mesa regions M to damage partial of the first conductive-type semiconductor layer 321. In one embodiment, the wavelength of the laser beam is less than 365 nm. In this process, an isolation trench T is formed by the laser in the first conductive-type semiconductor layer 321 and partial of the first major surface 301 of the substrate 30 is exposed and damaged so the isolation trench T is extended into the substrate 30 but not punched through the substrate 30.

A by-product 44 is also formed in the isolation trench T during the process. The by-product 44 contains the debris of laser irradiation from the semiconductor epitaxial stack 32 and the substrate 30. In one embodiment, the sidewall of the isolation trench T is roughened during the irradiating of the laser beam. In one embodiment, the slope of the sidewall of the isolation trench T is larger than the slope of the sidewall of the mesa region M.

Following, the semiconductor epitaxial stack 32 with the protective layer 34 is put into a warm chemical solution, e.g. an acid solution, for a predetermined period of time to perform a wet etching. The composition of the chemical solution can be phosphoric acid ($H_3PO_4$) and sulfuric acid ($H_2SO_4$). The preferred cleaning temperature of the chemical solution is higher than the atmospheric temperature. In one embodiment, the temperature of the chemical solution is 175~300° C. In one embodiment, the predetermined period of time can be 1~20 minutes.

The composition ratio of the chemical solution can be changed based on the user requirement. If the user prefers a shorter cleaning time, a chemical solution with a higher ratio of the $H_2SO_4$ and higher cleaning temperature can serve the purpose. The chemical solution has a good selectivity between the by-products B and the substrate 30.

Figure 3K:
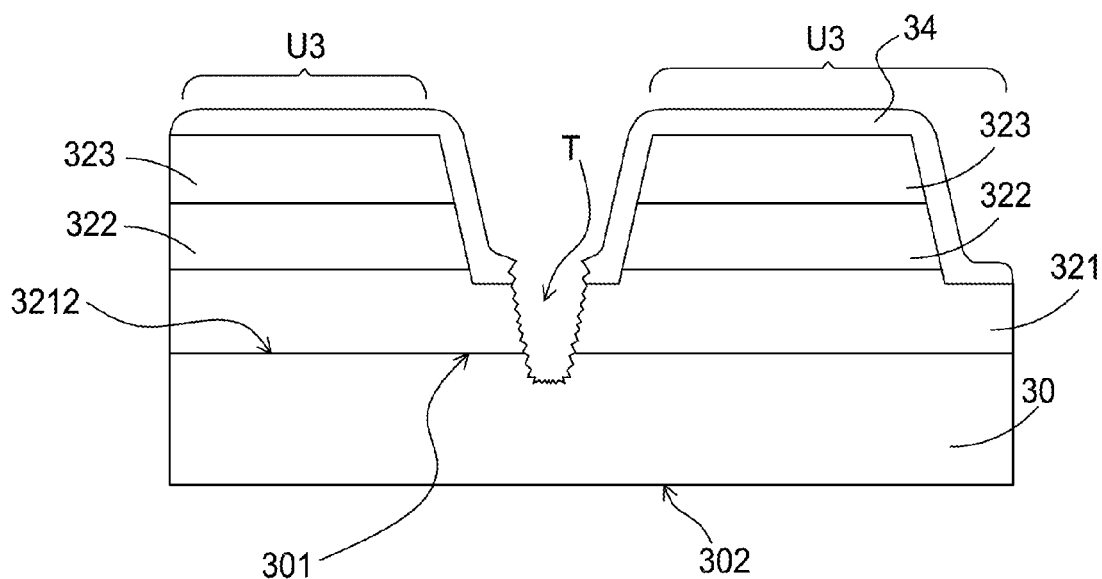

FIG. 3K illustrates most of the by-products B can be removed without damaging the substrate 30. In this embodiment, the protective layer 34 can protect the semiconductor epitaxial stack 32 during the two processes mentioned above, such as the laser process and the wet etching process to save the manufacturing cost and improve the manufacturing efficiency.

Figure 3L:
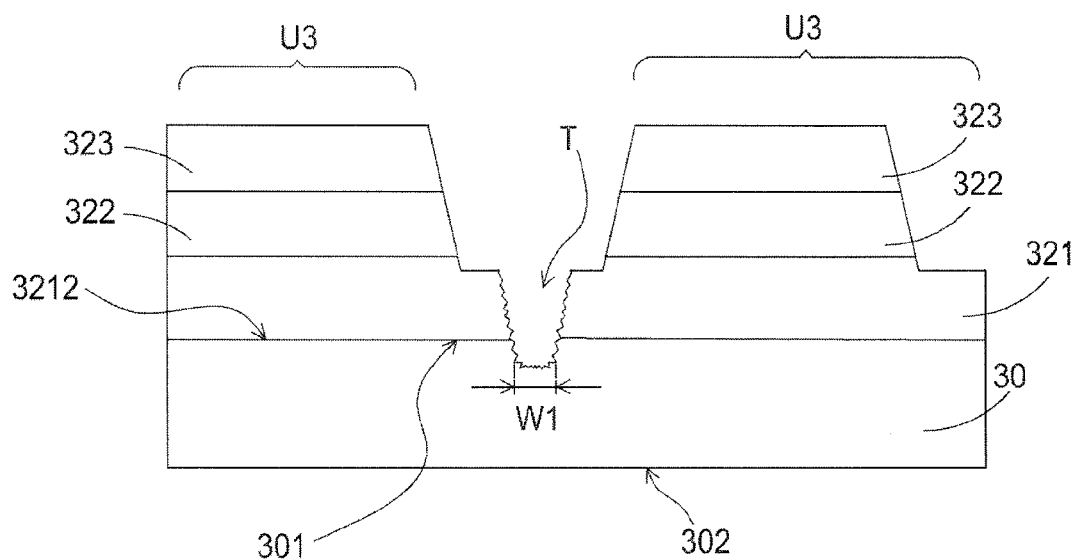

FIG. 3L illustrates the protective layer 34 is removed and the two light-emitting diode units U3 is separated by the isolation trench T. The isolation trench T formed through the first conductive-type semiconductor layer 321 can have a width W1. In the present embodiment, the width W1 of the isolation trench is gradually changed in a direction normal to the substrate 30. To be more specific, the width W1 of the isolation trench is gradually increased in a direction away from the substrate 30. The difference of a top width and a bottom width of the one isolation trench is of between 5 and 10 microns, and the bottom width is less than 10 microns.

Figure 3M:
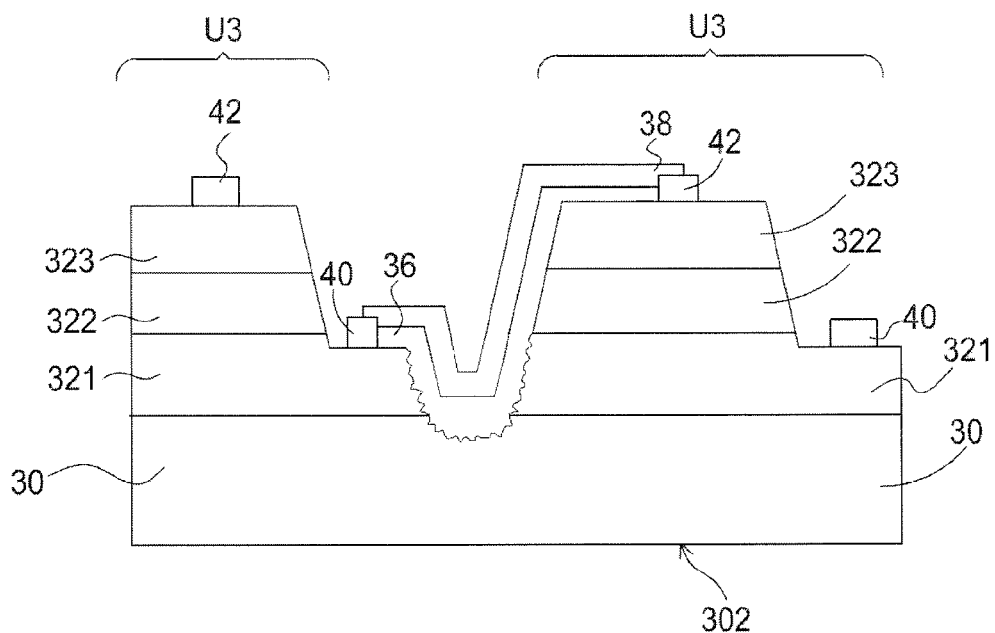

FIG. 3M illustrates a first electrode 40 is formed on the exposed area of the first conductive-type semiconductor layer 321 of one light-emitting diode units U3 and a second electrode 42 is formed on the second conductive-type semiconductor layer 323 of another light-emitting diode units U3 respectively. A wire 38 is formed to connect the first electrode 40 of the light-emitting diode unit U3 and the second electrode 42 of the adjacent light-emitting diode unit U3 to form serial circuits or parallel circuits between the two light-emitting diode units U3.

There can be air or an insulating layer 36 beneath the wire 38 wherein the insulating layer 36 is formed on the partial surface of light-emitting diode units U3 and first major surface 301 of the substrate 30 by CVD, PVD, sputtering and so on before forming the wire 38 to insulate the adjacent light-emitting diode units U3. The material of the insulating layer 36 can be $Al_2O_3$, $SiO_2$, AN, $SiN_X$, $TiO_2$, $Ta_2O_5$, or the combination thereof.

Figure 4A:
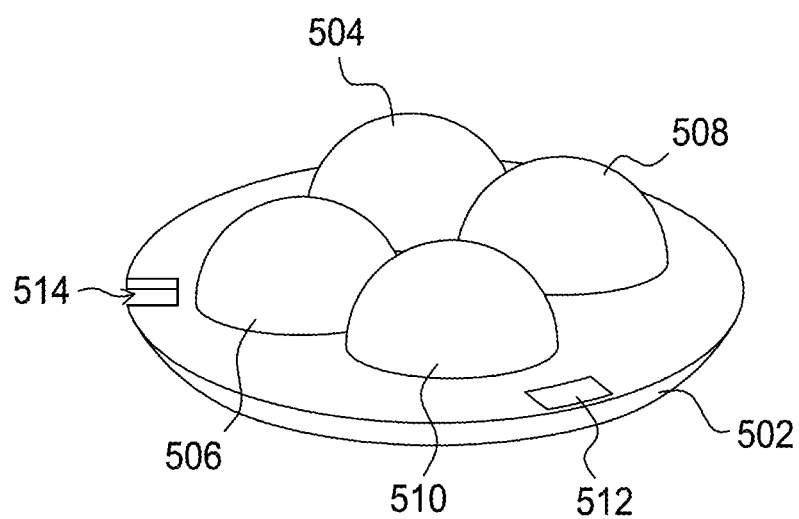
FIGS. 4A~4C illustrate an LED module of an embodiment in the present disclosure.
Figure 4B:
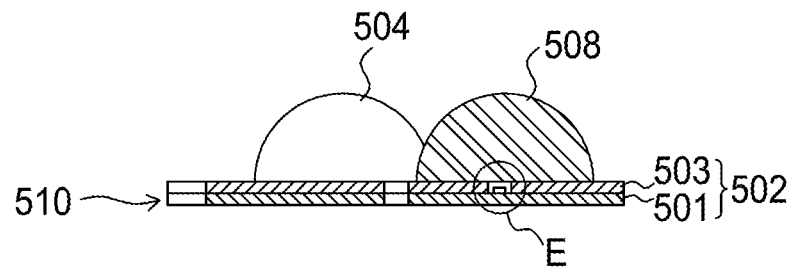
Figure 4C:
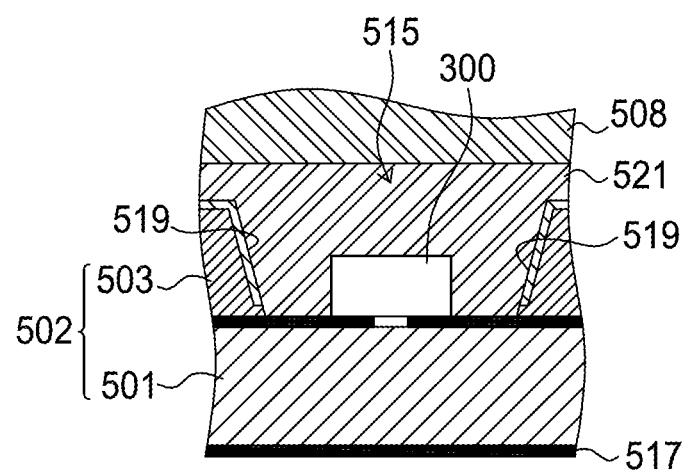

FIGS. 4A~4C illustrate an LED module of an application in the present disclosure. FIG. 4A is an external perspective view illustrating a light-emitting device module 500 including a submount 502, a light-emitting device (not shown) described above, a plurality of lens 504, 506, 508, 510, and two power supply terminals 512, 514. The LED module 500 is attached to a lighting unit 600 (mentioned later).

FIG. 4B is a planar view illustrating the light-emitting device module 500, and FIG. 4C is an enlarged view illustrating a portion E shown in FIG. 4B. As FIG. 4B shows, the submount 502 including an upper subunit 503 and a lower subunit 501, and at least one surface of the lower subunit 501 are contacted with the upper subunit 503. The lenses 504, 508 are formed on the upper subunit 503. In one embodiment, the material of the upper subunit 503 can be thermosetting resin or thermoplastic resin, for example epoxy molding compound (EMC) or silicone molding compound (SMC). At least one through hole 515 is formed on the upper subunit 503 and at least one of the light-emitting device 300 is formed inside the through hole 515 and contacted with the lower subunit 501. Besides, the light-emitting device 300 is encapsulated by an encapsulating material 521 wherein the material of the encapsulating material 521 may be a silicone resin, an epoxy resin or the like. And a lens 508 is optionally formed on the encapsulating material 521. In one embodiment, a reflecting layer 519 is formed on the sidewall of the through hole 515 to increase the light emitting efficiency. A metal layer 517 can be formed on the lower surface of the lower subunit 501 for improving heat dissipation.

Figure 5A:
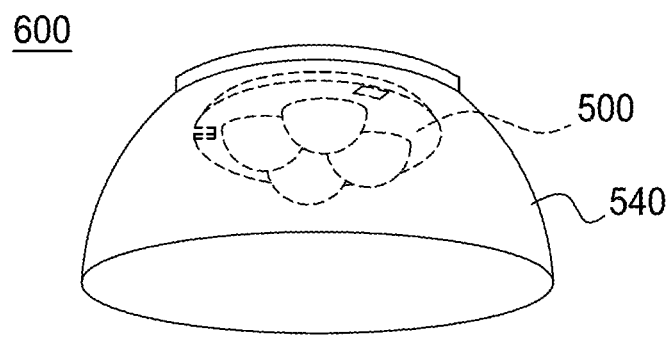
FIGS. 5A~5B illustrate a lighting apparatus of an embodiment in the present application form different perspectives.
Figure 5B:
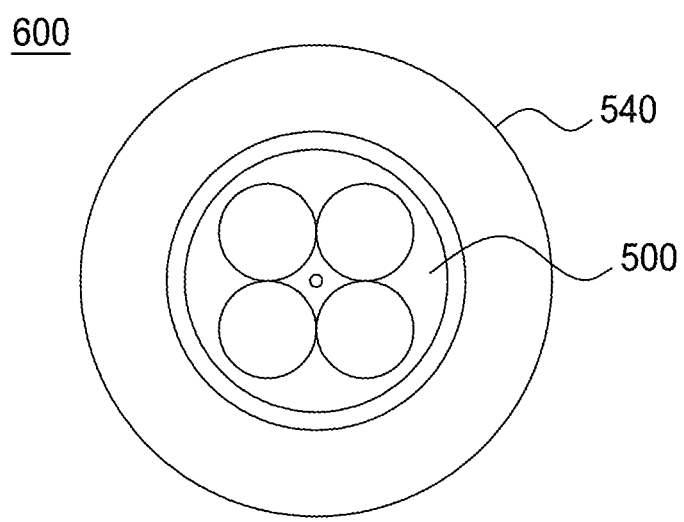

FIGS. 5A~5B illustrate a lighting apparatus of an embodiment in the present application form different perspectives. The lighting apparatus 600 includes a light-emitting device module 500, a case 540, a power supply circuit (not shown) to supply current to the lighting apparatus 600 and a control unit (not shown) to control the power supply circuit. The lighting apparatus 600 can be an illumination device, such as street lamps, headlights or indoor illumination light source, and can be a traffic sign or a backlight module of the display panel.

Figure 6:
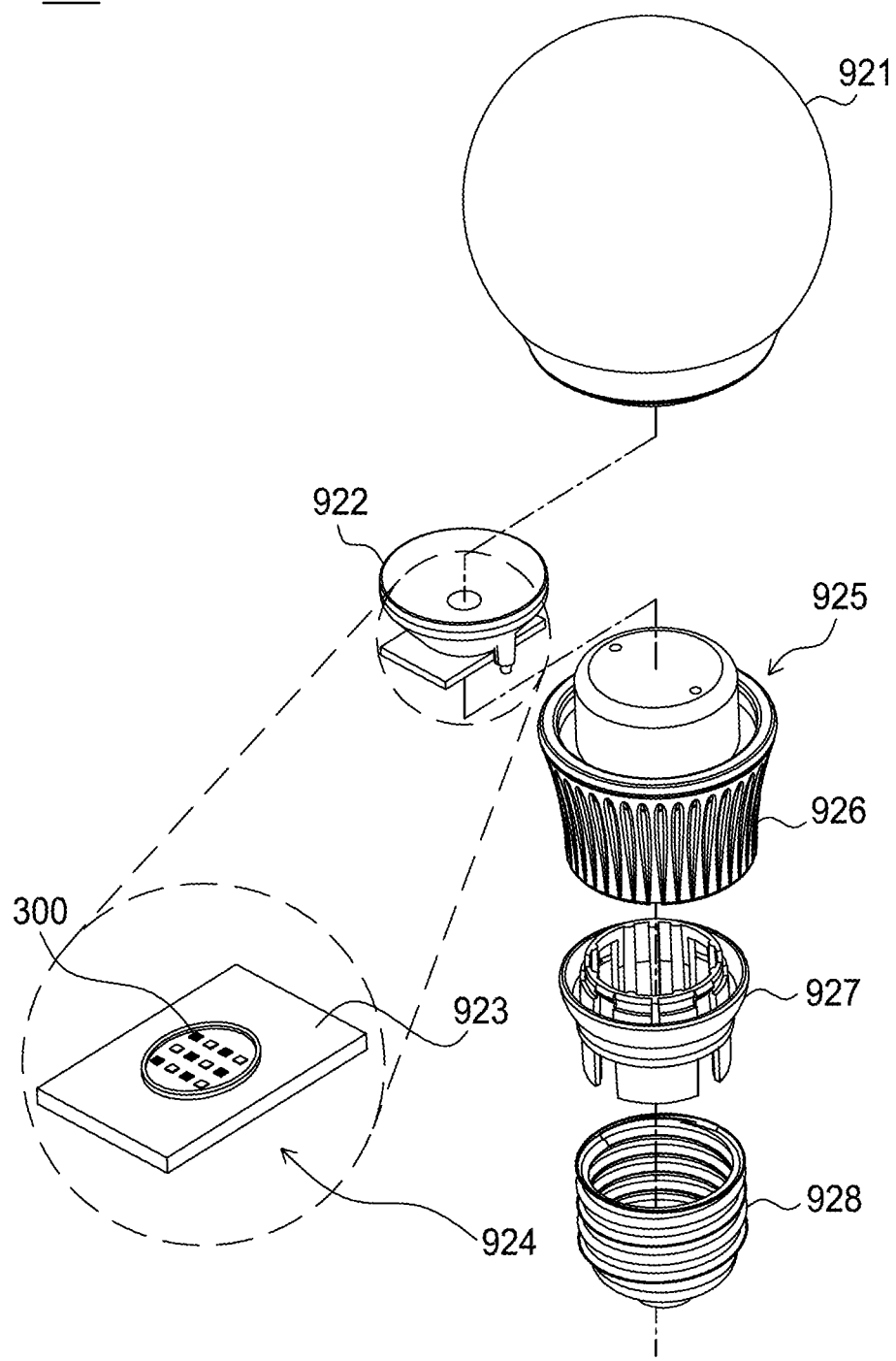
FIG. 6 is an explosive diagram of a bulb in accordance with an embodiment of the present application.

FIG. 6 shows an explosive diagram of a bulb in accordance with another application of the present application. The bulb 700 includes a cover 921, a lens 922, a lighting module 924, a lamp holder 925, a heat sink 926, a connecting part 927, and an electrical connector 928. The lighting module 924 includes a carrier 923 and a plurality of light-emitting device 300 of any one of the above mentioned embodiments on the carrier 923.

The substrate 30 can be a growth or carrying base. The material of the substrate 30 includes an electrically conductive substrate, electrically insulating substrate, transparent substrate, or opaque substrate. The material of the electrically conductive substrate can be metal such as Ge, Si and GaAs, oxide such as $LiAlO_2$ MgO and ZnO, nitrogen compound such as GaN and AlN, phosphide such as InP, silicon compound such as SiC, or Si. The material of the transparent substrate can be chosen from sapphire ($Al_2O_3$), $LiAlO_2$, ZnO, GaN, AlN, glass, diamond, CVD diamond, diamond-like carbon (DLC), spinel ($MgAl_2O_3$), $SiO_X$, or $LiGaO_2$.

A buffer layer (not shown) can be selectively disposed between the semiconductor epitaxial stack 32 and the substrate 30. The buffer layer is between the two material systems to transit the material system to the semiconductor system layer. For the structure of the light-emitting diode, the buffer layer is used to reduce the crystal mismatch between two materials. On the other hand, the buffer layer includes a single layer, multiple layers or a structure which includes two materials or two separated structures. The material of the buffer layer can be organic material, inorganic material, metal or semiconductor material. The structure of the buffer layer can be a reflector layer, a thermally conductive layer, an electrically conductive layer, an ohmic contact layer, an anti-deformation layer, a stress release layer, a bonding layer, a wavelength conversion layer or a mechanically fixing structure. In one embodiment, the material of the buffer layer can be AN or GaN, and the buffer layer can be formed by sputtering or atomic layer deposition (ALD).

A contacting layer (not shown) can be selectively formed on the semiconductor epitaxial stack 32 away from the substrate 30. Specifically, the contacting layer can be optical layer, electrical layer, or the combination thereof. The optical layer can change the radiation or the light from or entering the active layer 322 wherein the optical layer can change the frequency, the wavelength, the intensity, the flux, the efficiency, the color temperature, rendering index, light field, angle of view, etc. The electrical layer can change the value, density, distribution of voltage, resistance, current and capacitance of any two relative sides of the contacting layer. The material of the contacting layer includes oxide such as conductive oxide, transparent oxide and the oxide with the transparency over 50%, metal such as transparent metal and the metal with transparency over 50%, organic material, inorganic material, fluoresce material, ceramic, semiconductor material and doping semiconductor material. In some applications, the material of the contacting layer can be InTiO, CdSnO, SbSnO, InZnO, ZnAlO or ZnSnO. If the material of the contacting layer is transparent metal, the thickness of the contacting layer is in a range of 0.005 μm~0.6 μm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A method for manufacturing a light-emitting device, comprising the steps of:
   providing a substrate;
   forming a semiconductor epitaxial stack on the substrate, comprising:
      forming a first conductive-type semiconductor layer on the substrate;
      forming an active layer on the first conductive-type semiconductor layer; and
      forming a second conductive-type semiconductor layer on the active layer;
   forming multiple mesas in the semiconductor epitaxial stack and exposing part of the first conductive-type semiconductor layer; and
   forming multiple isolation trenches in the semiconductor epitaxial stack by using a laser beam irradiating the semiconductor epitaxial stack to define multiple light-emitting diode units,
   wherein part of the substrate is exposed by the isolation trenches, and
   wherein a sidewall of the isolation trenches is roughened and/or the slope of the sidewall of the isolation trenches is larger than the slope of a sidewall of the mesas.

2. The method for manufacturing a light-emitting device according to claim 1, wherein the isolation trenches are formed between the regions of the multiple mesas.

3. The method for manufacturing a light-emitting device according to claim 1, further comprising forming a protective layer on the semiconductor epitaxial stack before forming the isolation trenches.

4. The method for manufacturing a light-emitting device according to claim 1, wherein one of the isolation trenches has a width less than 10 microns.

5. The method for manufacturing a light-emitting device according to claim 1, wherein the width of the isolation trench is gradually changed in a direction normal to the substrate.

6. The method for manufacturing a light-emitting device according to claim 1, wherein the width of the isolation trench is gradually increased in a direction away from the substrate, and/or the difference of a top width and a bottom width of the isolation trench is of between 5 and 10 microns.

7. The method for manufacturing a light-emitting device according to claim 1, further comprising forming a wire on the isolation trenches for electrically connecting the multiple light-emitting diode units in series or parallel.

8. The method for manufacturing a light-emitting device according to claim 1, wherein the isolation trenches are extended into the substrate.

9. The method for manufacturing a light-emitting device according to claim 1, wherein the sidewall of the first conductive-type semiconductor layer in the isolation trenches is roughened.

10. The method for manufacturing a light-emitting device according to claim 1, further comprising a step of removing a by-product generated during irradiation of the laser beam by a chemical solution containing an acid under a predetermined cleaning temperature.

11. The method for manufacturing a light-emitting device according to claim 10, wherein the chemical solution comprises an aqueous solution of phosphoric acid, sulfuric acid or their mixture and/or the predetermined cleaning temperature is not lower than 200° C.

12. The method for manufacturing a light-emitting device according to claim 1, further comprising a step of forming multiple singulation trenches through the substrate to form multiple individual dies, wherein each individual die comprises a predetermined number of light-emitting diode units.

13. The method for manufacturing a light-emitting device according to claim 12, wherein one of the singulation trenches has a width equal to or larger than that of one of the isolation trenches.

14. The method for manufacturing a light-emitting device according to claim 12, wherein the singulation trenches are formed by a laser beam irradiating from either side of the substrate.

15. The method for manufacturing a light-emitting device according to claim 12, wherein the singulation trenches are formed before the multiple isolation trenches is formed.

16. The method for manufacturing a light-emitting device according to claim 12, wherein forming the singulation trenches comprises a step of forming first sub-trenches through the semiconductor epitaxial stack to a depth of the substrate and a step of forming second sub-trenches through the substrate from either side of the substrate.

17. The method for manufacturing a light-emitting device according to claim 12, further comprising a step of exposing part of the first conductive-type semiconductor layer or the substrate in the singulation trenches.

18. The method for manufacturing a light-emitting device according to claim 17, wherein the first conductive-type semiconductor layer or the substrate is exposed by a dry etching process.

19. A method for manufacturing a light-emitting device, comprising the steps of:
- providing a substrate;
- forming a semiconductor epitaxial stack on the substrate, comprising:
  - forming a first conductive-type semiconductor layer on the substrate;
  - forming an active layer on the first conductive-type semiconductor layer; and
  - forming a second conductive-type semiconductor layer on the active layer;
- forming multiple mesas in the semiconductor epitaxial stack and exposing partial of the first conductive-type semiconductor layer;
- forming a protective layer on the semiconductor epitaxial stack; and
- forming multiple isolation trenches in the semiconductor epitaxial stack by using a laser beam irradiating the semiconductor epitaxial stack between each of two adjacent mesas to define multiple light-emitting diode units,
- wherein part of the substrate is exposed by the isolation trenches.

* * * * *